United States Patent
Eid et al.

(10) Patent No.: US 12,327,775 B2
(45) Date of Patent: Jun. 10, 2025

(54) THERMAL PERFORMANCE IN HYBRID BONDED 3D DIE STACKS

(71) Applicant: Intel Corporation, Santa Clara, CA (US)

(72) Inventors: Feras Eid, Chandler, AZ (US); Adel Elsherbini, Tempe, AZ (US); Johanna Swan, Scottsdale, AZ (US); Shawna Liff, Scottsdale, AZ (US); Aleksandar Aleksov, Chandler, AZ (US); Julien Sebot, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 838 days.

(21) Appl. No.: 17/358,361

(22) Filed: Jun. 25, 2021

(65) Prior Publication Data

US 2022/0415743 A1    Dec. 29, 2022

(51) Int. Cl.
| | |
|---|---|
| *H01L 23/36* | (2006.01) |
| *H01L 21/50* | (2006.01) |
| *H01L 23/00* | (2006.01) |
| *H01L 25/065* | (2023.01) |
| *H10D 88/00* | (2025.01) |

(52) U.S. Cl.
CPC .............. *H01L 23/36* (2013.01); *H01L 21/50* (2013.01); *H01L 24/95* (2013.01); *H01L 25/0657* (2013.01); *H10D 88/00* (2025.01)

(58) Field of Classification Search
CPC ..... H01L 21/50; H01L 23/36; H01L 27/0688; H01L 25/0657
See application file for complete search history.

(56) References Cited

U.S. PATENT DOCUMENTS

| | | | |
|---|---|---|---|
| 8,779,599 B2* | 7/2014 | Lin | ........................ H01L 21/561 257/725 |
| 11,646,255 B2* | 5/2023 | Pan | ..................... H01L 23/5383 257/668 |
| 2013/0119552 A1* | 5/2013 | Lin | ........................ H01L 23/481 257/E23.174 |
| 2021/0043544 A1* | 2/2021 | Eid | ..................... H03H 9/02102 |

* cited by examiner

*Primary Examiner* — Dale E Page
*Assistant Examiner* — Wilner Jean Baptiste
(74) *Attorney, Agent, or Firm* — Essential Patents Group, LLP (57) ABSTRACT

Hybrid bonded 3D die stacks with improved thermal performance, related apparatuses, systems, and methods of fabrication are disclosed. Such hybrid bonded 3D die stacks include multiple levels of dies including a level of the 3D die stack with one or more integrated circuit dies and one or more thermal dies both directly bonded to another level of the 3D die stack.

20 Claims, 8 Drawing Sheets

THERMAL PERFORMANCE IN HYBRID BONDED 3D DIE STACKS

BACKGROUND

The integrated circuit industry is continually striving to produce ever faster, smaller, and more efficient integrated circuit devices, packages, and systems for use in various electronic products, including, but not limited to, client devices (inclusive of portable client devices, desktop client devices, etc.), server devices, and others.

Current assembly processes have constraints on the numbers and minimum sizes of dies that can be bonded to another die or wafer due, in part, to constraints from pick and place assembly processing. As a result, there are difficulties in 3D die stacks in terms of thermal management and other concerns. For example, certain locations in the 3D die stack have hotspots that cause lower device performance and even device failure. Current techniques rely on using large dies (e.g., silicon dies) in the 3D die stacks for both electrical functionality and thermal management. Notably, silicon provides adequate thermal management (e.g., thermal conductivity) in some contexts; however, improvements are needed.

It is desirable to provide 3D die stacks with improved thermal performance to provide devices with enhanced capabilities and greater reliability. It is with respect to these and other considerations that the present improvements have been needed. Such improvements may become critical as the desire to provide improved integrated circuit devices, packages, and systems becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Integrated circuit structures, 3D die stack structures, devices, apparatuses, computing platforms, and methods are described herein related to improved thermal performance in hybrid bonded 3D die stacks.

As described above, current assembly processes have constraints on the numbers and minimum sizes of dies that can be bonded to another die or wafer, which causes problems in the thermal management optimization of a 3D die stack. In some embodiments, thermal management in 3D die stacks is improved by having a small thermal die that is either passive (e.g., more thermally conductive than the material of an integrated circuit die, such as Si, with no electrical functionality) or active (e.g. a thermoelectric cooling module) and that is bonded to particular locations (e.g., hotspots) to conduct the heat away. Notably, the small space available for such a thermal die and/or the large number of dies that would require to be bonded, is not compatible with current assembly processes, such as pick and place operations.

In some embodiments, the techniques discussed herein provide for the disaggregation of a single die (e.g., a Si die) into multiple smaller dies that are better optimized for thermals and using self-assembly bond the smaller dies into a 3D die stack. For example, in place of a single Si die having devices in one region and no devices in another region, with the region having no devices being used for passive thermal conductivity, multiple dies may be provided with an IC die replacing the portion of the die in device region and a specialized thermal die in place of the region having no devices for improved thermal management. As used herein, the term IC die indicates a die that provides electrical functionality. The IC die may be dedicated to one or more purposes such as memory, logic, signal routing, power routing, or others, or combinations thereof. It is noted that an IC die may also provide thermal functionality but it does so in addition to such electrical functionality. In contrast, the term thermal die indicates a die having no such electrical functionality but that is instead employed for thermal management. The thermal die may be passive such that it is more thermally conductive than the material of the IC dies (e.g., having a greater thermal conductivity) or the thermal die may be active such that a thermoelectric cooling module is employed. In the context of thermal conductivity, the thermal conductivity of a die indicates the measure of an ability to conduct heat. Such thermal conductivity may be measured or the thermal conductivity of the bulk of material of the die (e.g., silicon for an IC die and the selected material of the thermal die) may be used in place of measurement. As used herein, the term 3D die stack indicates a stack of devices having vertically aligned layers such that two or more of the layers employ one or more integrated circuit (IC) dies each. The term layer of a 3D die stack indicates a horizontal portion of the 3D die stack that includes only one depth of device within the horizontal portion (e.g., each layer may have any number of dies, thermal or IC or both but only a single die at any position therein).

The techniques discussed herein provide better thermal management in 3D die stacks and devices that employ them, which can manifest in reduced junction temperatures, higher power capability, and/or better steady state or turbo performance of the device.

Figure 1:
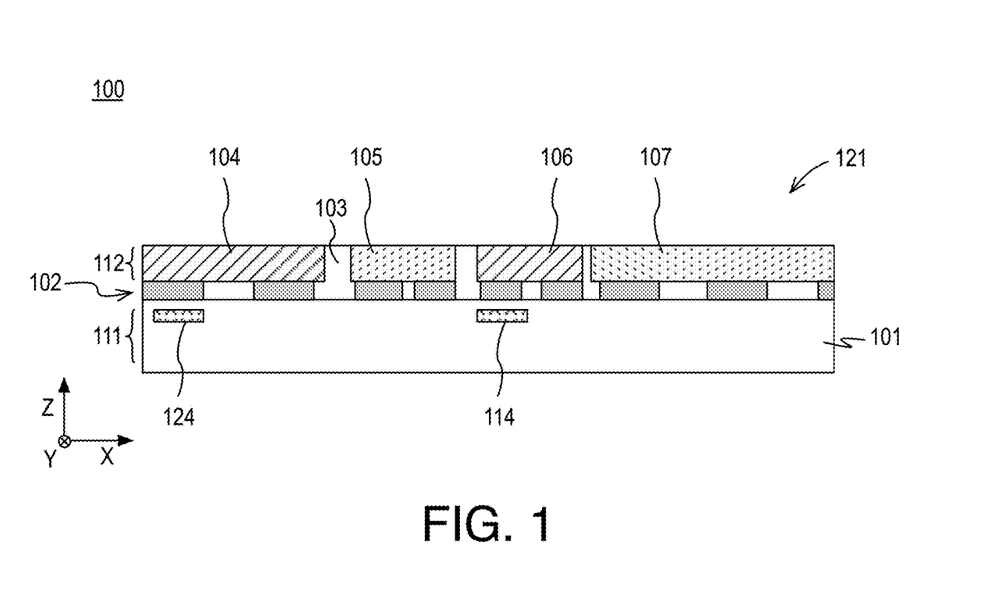
FIG. 1 is an illustration of a cross-sectional side view of an integrated circuit (IC) structure having improved thermal performance.

FIG. 1 is an illustration of a cross-sectional side view of an integrated circuit (IC) structure 100 having improved thermal performance, arranged in accordance with at least some implementations of the present disclosure. IC structure 100 may also be characterized as an assembly structure, assembly, apparatus, system, die stack, package etc. As shown, IC structure 100 includes an IC die 101 at a first level 111 of a 3D die stack 121. As discussed, an IC die indicates a die having circuitry therein for use in an electrical functionality of IC structure 100 (and the device employing IC structure 100) and is inclusive of memory, logic, signal routing, and others. Although illustrated with respect to first level 111 having a single IC die 101, first level 111 may have any number of IC dies and/or thermal dies. In some embodiments, first level 111 may be mounted on a carrier substrate (not shown) that is later removed. IC die 101 of 3D die stack 121 may be a part of a wafer of many IC dies or IC die may be a single diced die.

IC die 101 may include any number of device layers built on and in a substrate, for example, and any number of interconnect layers over the device layer(s) (i.e. offset in the z-direction relative to the device layer(s)) The device layer (s) may include any suitable devices such as transistors, logic devices, memory devices, capacitors, resistors, etc. As shown, one or more areas of the device layer(s) and/or interconnect layers may include hotspots 124, 114. Such hotspots 124, 114 may be found in locations having higher device density, in locations having devices that are dedicated to particular tasks (e.g., hotspots 124, 114 may occur in particular areas when video decoding, for example, is performed), and so on. Such hotspots 124, 114 may be characterized in that they cause greater heat output at particular times during operation relative to other locations. Notably, such hotspots 124, 114 may be at different locations depending on a task the device that incorporates IC structure 100 is performing. Although illustrated with two hotspots 124, 114, IC die may have any number of hotspots. It is noted that hotspots 124, 114 are not illustrated after FIG. 2 for the sake of clarity of presentation.

As shown, a thermal die 104 and a thermal die 106 may be advantageously positioned over hotspots 124, 114 while IC dies 105, 107 are positioned over other areas (e.g., areas of little or no hotspots). As discussed a thermal die indicates a die having no data generation or storage or signal routing purpose for IC structure 100. Instead, thermal dies 104, 106 are deployed for thermal management of IC structure 100. Notably, IC dies 105, 107 and thermal dies 104, 106 have similar form factors and, in particular, z-heights such that they may be deployed in the same second level 112 of 3D die stack 121. Although illustrated with two levels 111, 112, 3D die stack 121 may include any number of levels such as three, four, or more.

Thermal die 104 and thermal die 106 may be the same type of thermal dies (e.g., both passive having the same material(s) or both active) or they may be different (e.g., both passive having different material(s) or one passive and one active). Furthermore, second level 112 may incorporate any number of IC dies and thermal dies as discussed further herein below. In some embodiments, one or both of thermal dies 104, 106 are active thermal dies. For example, one or both of thermal dies 104, 106 may be thermoelectric cooling modules that provide active cooling when powered on. For example, Peltier device thermoelectric cooling modules may be deployed.

In some embodiments, one or both of thermal dies 104, 106 are passive thermal dies. As used herein, the term passive thermal die indicates a die having a greater thermal conductivity than any IC die in the same level and/or 3D die stack. Thereby, the passive thermal die provides improved thermal management by moving heat more quickly from hotspots 124, 114. In some embodiments, IC die 101, 105, 107 have silicon substrates and therefore have a thermal conductivity approximately of that of silicon or other substrate material such as III-V semiconductors, silicon germanium semiconductors, and others. For example, silicon has a thermal conductivity of about 120 W/(m·K). Other semiconductor device substrates have a thermal conductivity of about the same order.

In contrast, one or both of thermal dies 104, 106 may employ any material having a thermal conductivity greater than that of IC dies 101, 105, 107. In some embodiments, one or both of thermal dies 104, 106 employ material(s) having a thermal conductivity of not less than 1.5 times to 3 times the thermal conductivity of each of IC dies 101, 105, 107. In some embodiments, one or both of thermal dies 104, 106 employ material(s) having a thermal conductivity of not less than four times the thermal conductivity of each of IC dies 101, 105, 107. In some embodiments, one or both of thermal dies 104, 106 is or includes copper, which has a thermal conductivity of about 400 W/(m·K). In some embodiments, one or both of thermal dies 104, 106 is or includes aluminum nitride, which has a thermal conductivity greater than about 200 W/(m·K). In some embodiments, one or both of thermal dies 104, 106 is or includes silicon carbide, which has a thermal conductivity greater than about 250 W/(m·K).

In some embodiments, one or both of thermal dies 104, 106 employ material(s) having a thermal conductivity of nearly an order of magnitude higher than that of IC dies 101, 105, 107. In some embodiments, one or both of thermal dies 104, 106 employ material(s) having a thermal conductivity of not less than eight times the thermal conductivity of each of IC dies 101, 105, 107. In some embodiments, one or both of thermal dies 104, 106 employ material(s) having a thermal conductivity of not less than nine times the thermal conductivity of each of IC dies 101, 105, 107. In some embodiments, one or both of thermal dies 104, 106 is or includes diamond, which has a thermal conductivity of about 1,000 to 2,000 W/(m·K). Other materials may be used. In some embodiments, one or both of thermal dies 104, 106 includes boron arsenide, which has a thermal conductivity of about 1,300 W/(m·K).

Such materials may be used alone or in any combination. In some embodiments, one or both of thermal dies 104, 106 may include one or more of diamond, copper, silver, gold, aluminum nitride, boron arsenide, silicon carbide, or combinations thereof. In some embodiments, one or both of thermal dies 104, 106 includes a material stack of such materials. For example, one or both of thermal dies 104, 106 may include a core material and one or more material layers on surfaces thereof.

In contrast to providing only IC dies, inclusive of regions without circuitry that are used for heat dissipation, the architecture of 3D die stack 121 offers numerous advantages. For example, 3D die stack 121 disaggregates a single large die (e.g., that would provide both electrical and thermal functionality) into smaller disaggregated dies, some of which provide electrical functionality (i.e., IC dies 105, 107) and others that provide thermal functionality (i.e., thermal dies 104, 106). Such disaggregation reduces thermal cross-talk (e.g., in the x-y plane), thereby protecting temperature sensitive devices and improves 1-dimensional heat conduction (e.g., in the z-direction) by replacing a portion of the single large die (e.g., Si) with another die (i.e., thermal dies 104, 106) that is more efficient in heat removal. In FIG. 1, for example, two large silicon dies are disaggregated to 4 smaller dies: IC dies 105, 107 (e.g., two silicon dies for electrical functionality) and thermal dies 104, 106 (e.g., two thermal dies for heat transfer). Thermal dies 104, 106 do not provide electrical functionality such as high speed signaling, and are used only to improve thermals. As discussed, one or both of thermal dies 104, 106 may be passive and made of materials that are more thermally conductive than, for example, silicon, such as diamond, copper, silver, gold, aluminum nitride, boron arsenide, silicon carbide, or combinations thereof. Thermal dies 104, 106 may also be active, such as thermoelectric cooling modules that provide active cooling when powered on. This disaggregation protects temperature sensitive devices in IC dies 105, 107 by reducing thermal cross-talk (e.g., in the x-y plane) and improves thermal management by replacing portions of the original large dies that are not used for electrical functionality with other materials and/or active devices that are more effective at heat removal.

As shown in FIG. 1, each of IC dies 105, 107 and thermal dies 104, 106 are direct bonded to IC die 101, in accordance with some embodiments. In other embodiments, one or more of IC dies 105, 107 and thermal dies 104, 106 may be direct bonded to another IC die or thermal die of first level 111. IC dies 105, 107 and thermal dies 104, 106 are direct bonded to IC die 101 via composite metallization structures 102. As used herein, the term direct bonded indicates a bonding via a composite metal structure including metallization from each of the bonded dies. Notably, no intervening metallization is therebetween. The term composite metal structures indicates a metal structure or metallization that is made up of two or more metal sub-structures or metallizations. In the context of 3D die stack 121, composite metallization structures 102 may each be formed from a metal structure on IC die 101 and a metal structure on one of IC dies 105, 107 and thermal dies 104, 106 via hybrid bonding as discussed further herein. Such hybrid bonding may bond the metal structures via metal inter-diffusion between the metal structures. Furthermore, the hybrid bonding may also include dielectric material to dielectric material bonds that are part of dielectric material 103. For example, dielectric material 103 may include dielectric material from IC die 101, IC dies 105, 107 and thermal dies 104, 106 and a dielectric fill material.

IC structure 100 includes IC die 101 (or more IC dies) in a first level 111 of 3D die stack 121, a number of IC dies such as IC dies 105, 107 in a second level 112 of 3D die stack 121 coupled to IC die 101 and a number of thermal dies such as thermal dies 104, 106 in second level 112 of 3D die stack 121 and coupled to IC die 101 such that each of the thermal dies 104, 106 has a greater thermal conductivity than each of IC dies 105, 107 or each is an active thermal cooling die. 3D die stack 121 may be packaged in any suitable manner such that IC die 101 is a bottom die (e.g., IC die 101 is attached to a package substrate) or IC die 101 is a top die (e.g., second level 112 is attached to a package substrate). Furthermore, 3D die stack 121 may include any number of additional levels over second level 112 with each including at least one IC die and any number of thermal dies (or absent thermal dies).

Notably, 3D die stack 121 may include disaggregated dies of small sizes to selectively provide thermal solutions in place of unused portions of IC dies for improved thermal performance inclusive of less thermal cross talk and improved 1-dimensional heat removal. In some embodiments, substantially small thermal dies and/or IC dies may be required to enable 3D die stack 121. The ability to assemble a large number of small dies may be provided by batch self-assembly as discussed herein. Notably, such batch self-assembly may advantageously assemble smaller dies relative to, for example, pick and place assembly operations due to pick and place not being efficient in the context of small dies of large numbers. Furthermore combining batch self-assembly and hybrid bonding, thermally efficient, high density, and small z-height 3D die stacks are advantageously formed. In some embodiments, one or both of thermal dies 104, 106 and/or one or both of IC dies 105, 107 have a largest dimension in plane with a surface of IC die 101 that is not more than 5 mm. For example, the largest in plane dimension may be a larger of the width or length of the die. In some embodiments, one or both of thermal dies 104, 106 and/or one or both of IC dies 105, 107 have a largest dimension in plane with a surface of IC die 101 that is not more than 2 mm. In some embodiments, one or both of thermal dies 104, 106 and/or one or both of IC dies 105, 107 have a largest dimension in plane with a surface of IC die 101 that is not more than 1 mm. Furthermore, in some embodiments, the total number of thermal dies 104, 106 and IC dies 105, 107 in first level 111 is not less than 8 dies. In some embodiments, total number of thermal dies 104, 106 and IC dies 105, 107 in first level 111 is not less than 12 dies. In some embodiments, total number of thermal dies 104, 106 and IC dies 105, 107 in first level 111 is not less than 16 dies. However, any number of dies of any size may be employed in 3D die stack 121.

Figure 2:
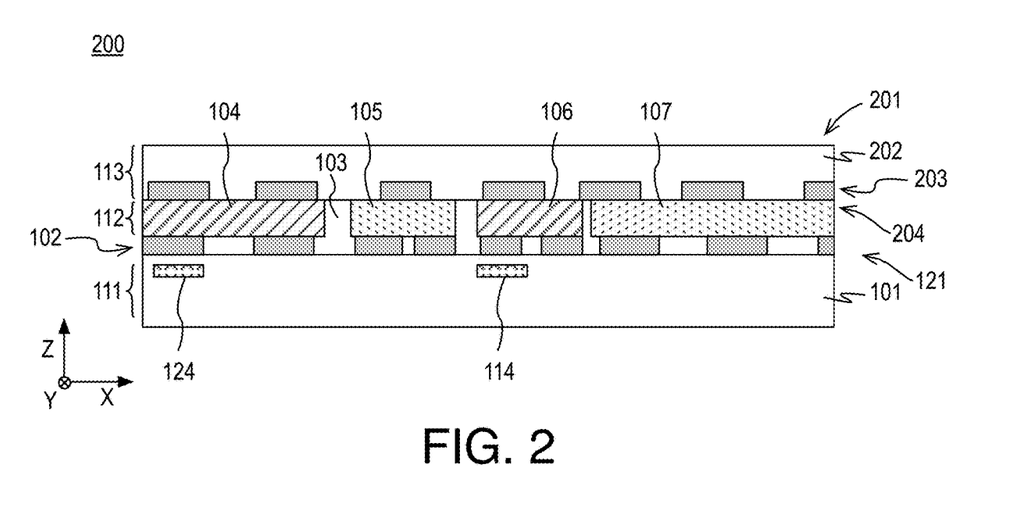
FIG. 2 is an illustration of a cross-sectional side view of an assembly structure having improved thermal performance.

FIG. 2 is an illustration of a cross-sectional side view of an assembly structure 200 having improved thermal performance, arranged in accordance with at least some implementations of the present disclosure. Assembly structure 200 may also be characterized as an IC circuit structure, assembly, apparatus, system, package, etc. As shown, assembly structure 200 includes an engineered heat spreader 201 coupled to one or more dies of second level 112 (e.g., IC dies 105, 107 and/or thermal dies 104, 106). As used herein, the term engineered heat spreader indicates a continuous heat spreader direct bonded over second level 112 in analogy to the direct bond of second level 112 to first level 111. Notably, no thermal interface material is provided between second level 112 and third level. For example, engineered heat spreader 201 may be added as a third level of 3D die stack 121 and may include one or more bulk heat spreader materials 202 direct bonded to one or more of thermal dies 104, 106 and IC dies 105, 107 via composite metal structures 203. As discussed, composite metal structures 203 indicate a metal structure or metallization that is made up of two or more metal sub-structures or metallizations one from each of second level 112 and third level, for example.

As shown, engineered heat spreader 201 includes one or more bulk heat spreader materials 202. Heat spreader material 202 may include any suitable heat spreading material or materials with a high thermal conductivity (e.g., greater than 300 W/(m·K)). In some embodiments, the heat spreading material or materials may be selected to have a low and/or tuned coefficient of thermal expansion relative to other components of 3D die stack 121. In some embodiments, heat spreader material 202 includes copper. In some embodiments, heat spreader material 202 includes copper and diamond. In some embodiments, heat spreader material 202 includes diamond absent copper. In some embodiments, heat spreader material 202 includes silicon carbide. For example, the bulk heat spreader material may include copper, diamond, silicon carbide, other high thermal conductivity materials such as silver, gold, aluminum nitride, boron arsenide, or combinations of any of such materials.

Engineered heat spreader 201 is direct bonded to one or more of IC dies 105, 107 and thermal dies 104, 106 via composite metal structures 203. Composite metal structures 203 may include any suitable material such as copper. As discussed, direct bonding indicates bonding via a composite metal structure including metallization from each of the bonded components with no intervening metallization therebetween. In some embodiments, a dielectric material (not shown) extends in-plane between composite metal structures 203 in analogy with dielectric 103 to provide a hybrid bonded structure.

As shown in FIG. 2, assembly structure 200 includes engineered heat spreader 201 over surfaces 204 of IC dies 105, 107 and thermal dies 104, 106 such that surfaces 204 are opposite IC die 101. For example, third level is over second level 112, which is over first level 111. Engineered heat spreader 201 is direct bonded to one or both of IC dies 105, 107 and to one or both of thermal dies 104, 106 via composite metal structures 203 directly coupled to engineered heat spreader 201 and one or both of IC dies 105, 107 and one or both of thermal dies 104, 106. Engineered heat spreader 201 may be direct or hybrid bonded to second level 112 as discussed further herein. Notably, although disaggregation of dies as discussed herein improves 1-dimensional (e.g., z-direction) heat transfer and advantageously reduces cross-talk, lack of x-y plane heat spreading may result, which is resolved by engineered heat spreader 201.

Figure 3:
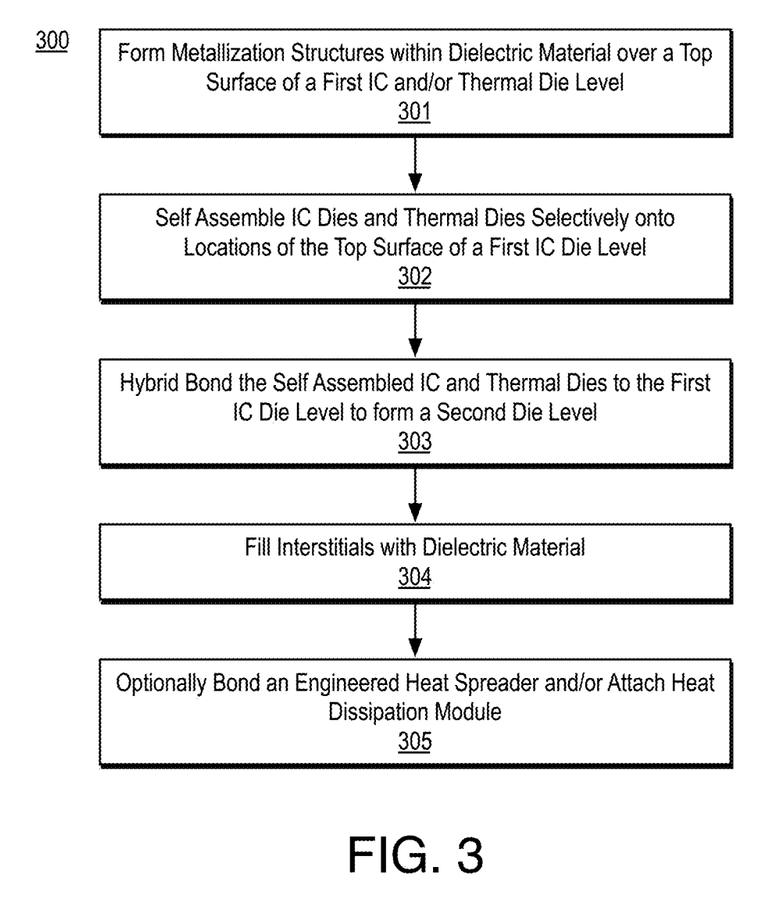
FIG. 3 provides a flow diagram illustrating an example process for fabricating IC structures inclusive of 3D die stacks with improved thermal performance and related assemblies.

FIG. 3 provides a flow diagram illustrating an example process 300 for fabricating IC structures inclusive of 3D die stacks with improved thermal performance and related assemblies, arranged in accordance with at least some implementations of the present disclosure. For example, process 300 may be implemented to fabricate IC structure 100, assembly structure 200, or any other structure discussed herein inclusive of IC structure 900 and assembly structure 1000. In the illustrated embodiment, process 300 includes one or more operations as illustrated by operations 301-305. However, embodiments herein may include additional operations, certain operations being omitted, or operations being performed out of the order provided.

Process 300 begins at operation 301, where metallization structures such as metallization pads are formed within a dielectric material over a surface of a first die level having one or more IC dies and any number of thermal dies (or no thermal dies). A die level may also be characterized as a die layer or die stratum. In some embodiments, the first die level includes a single die or a wafer of multiple single dies to be diced at later processing. In other embodiments, the first die level may include multiple dies on a carrier substrate, which is later removed. Herein, operations are illustrated with respect to a single IC die in the first layer for the sake of clarity of presentation. However, other configurations are available. The discussed metallization structures within a dielectric material are also formed over a surface of multiple IC dies and thermal dies that are to be bonded to the first level die(s). Such metallization structures within a dielectric material may be using the same or other techniques.

In some embodiments, a bulk dielectric layer over the surface of the first die level is patterned using lithography and etch techniques and the patterned dielectric layer is filled with a metallization such as copper. However, bulk metallization patterning followed by dielectric fill operations may also be employed. The resultant structure may then be planarized using chemical mechanical polish techniques to provide a very fine roughness (very low roughness) and smooth layer for subsequent hybrid or direct bonding. As discussed, the same or similar operations are performed on each of the dies of the second level to be bonded to the first level.

Figure 4:
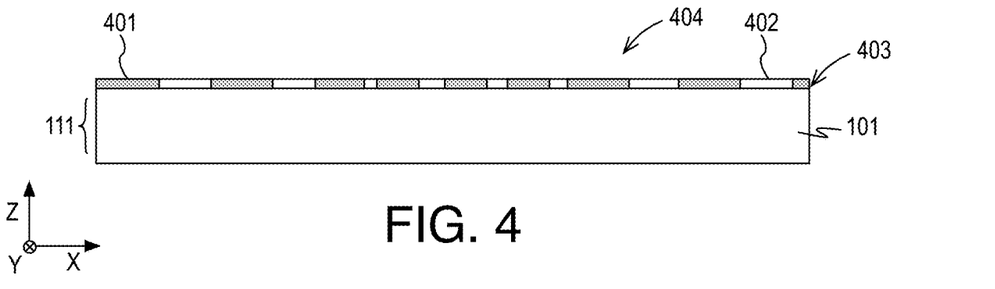
FIG. 4 illustrates an IC structure after the formation of metallization structures within a dielectric material in preparation for hybrid bonding

FIG. 4 illustrates an IC structure 400 after the formation of metallization structures 401 within a dielectric material 402 in preparation for hybrid bonding, arranged in accordance with at least some implementations of the present disclosure. As shown, a number of metallization structures 401 are formed within dielectric material 402 over a surface 403 (i.e., top surface) of IC die 101 (i.e., one or more dies) of first level 111. As discussed, a surface 404 of metallization structures 401 and dielectric material 402 may be planarized to a smooth finish for subsequent hybrid or direct bonding. Metallization structures 401 may include any suitable material or materials that facilitate direct bonding such as a material or material stack with an outfacing metal of copper being advantageous. Furthermore, dielectric material 402 may include any suitable material or materials that also facilitate direct bonding such as a material or material stack with an outfacing dielectric of silicon dioxide or silicon nitride. In some embodiments, dielectric material 402 is a bulk material of silicon dioxide or silicon nitride through a thickness thereof.

Figure 5:
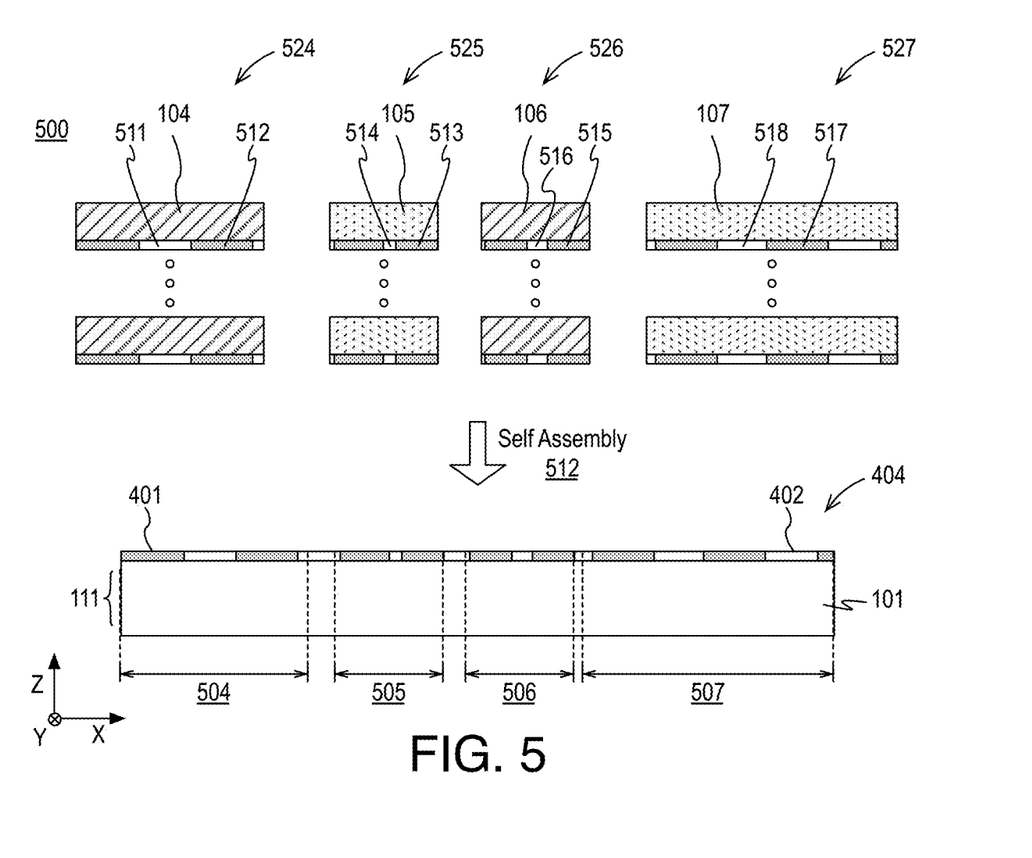
FIG. 5 illustrates an IC structure similar to the IC structure of FIG. 4 as IC die structures and thermal die structures are being batch self aligned thereto.

Furthermore, each of the IC dies and thermal dies to be direct bonded to surface 403 may be preprocessed in the same manner such that each (or one or more) includes one or more metallization structures within a dielectric material such that surface(s) of the metallization structure(s) and a surface of the dielectric material are exposed and polished to a smooth finish for bonding, as shown in FIG. 5 herein below. In some embodiments, metallization structures 401 and the metallization structures of the second level IC dies and thermal dies to be direct bonded to surface 403 include the same outward facing metal materials (e.g., copper), and the dielectric layer of the second level IC dies and thermal dies to be direct bonded to surface 403 also include the same outward facing dielectric materials (e.g., silicon dioxide or silicon nitride).

Returning to FIG. 3, processing continues at operation 302, where batch self assembly is performed to align second level IC and thermal dies over the first level of one or more IC dies. For example, one or more of each of the second level IC and thermal dies may be brought into contact or into proximity of the exposed surface of the first level with region for each of the types of IC and thermal dies as the predetermined location of each. The second level IC and thermal dies then self assemble or align to such regions based on the mechanism of the self assembly being deployed. Such self assembly of the second level IC and thermal dies may be performed using any suitable technique or techniques.

In some embodiments, batch self-assembling the second die level over the first die level includes one of alignment of a first hydrophobic surface of one of a thermal die or an integrated circuit die to a second hydrophobic surface of one of the first or second regions in a water medium. For example, a target region of the first level die surface and the surface of the second level IC die or thermal die may each be coated with a hydrophobic material layer. The second level IC die or thermal die and the first level die surface may then be put in a water medium (or the first level die surface may be covered in a water medium) such that the second level IC die or thermal die self aligns to the first level die surface based on each being hydrophobic. Such processes may be repeated in parallel or in series for any number of second level dies and corresponding target regions. In some embodiments, batch self-assembling the second die level over the first die level includes magnetically aligning one of the thermal die or the integrated circuit die. For example, a magnetic jig may be placed over or under the first die level and the second level IC die or thermal die may include a magnetic material thereon such that magnetic forces are used to align the second level IC die or thermal die to their corresponding target regions. In some embodiments, batch self-assembling the second die level over the first die level includes aligning one of the thermal die or the integrated circuit die using shape matching. For example, a shape based jig may be used and each of the second level IC die or thermal die may self align to their target regions based on having a shape that matches the opening in the jig placed over the region. Other batch self assembly techniques may be used. In some embodiments, the batch self-assembling includes a single batch self-assembling operation that contemporaneously aligns the thermal die and the integrated circuit die in parallel. As used herein, the term contemporaneously indicates the second level dies (or other level) are aligned in the same batch at substantially the same time.

FIG. 5 illustrates an IC structure 500 similar to IC structure 400 as IC die structures 525, 527 and thermal die structures 524, 526 are being batch self aligned thereto, arranged in accordance with at least some implementations of the present disclosure. As shown, IC die structure 525 includes IC die 105 and metallization structures 513 within a dielectric material 514. Similarly, IC die structure 527 includes IC die 107 and metallization structures 517 within a dielectric material 518. Furthermore, thermal die structures 524, 526 include thermal dies 104, 106, metallization structures 512, 515 and dielectric materials 511, 516, respectively. Such metallization structures and dielectric materials may be formed as discussed with respect to operation 301. For example, the metallization structures and dielectric materials may be formed over a wafer of like dies which is then diced to IC die structures 525, 527 and thermal die structures 524, 526.

As shown, any number of such IC die structures 525, 527 and thermal die structures 524, 526 are brought into contact or into close proximity of surface 404. Each die structure has a target region such that thermal die structure 524 is to align to region 504, thermal die structure 526 is to align to region 506, IC die structure 525 is to align to region 505, and IC die structure 527 is to align to region 507. Self assembly operation 512 may be performed using any suitable technique or techniques such as those discussed with respect to operation 302. In some embodiments, batch self-assembly includes alignment of hydrophobic surfaces to one another (e.g., hydrophobic die structures 524, 525, 526, 527 to corresponding hydrophobic regions 504, 505, 506, 507), magnetically aligning the thermal dies and IC dies to their corresponding regions, or aligning the thermal dies and IC dies to their corresponding regions using shape matching techniques. Other batch assembly techniques may be deployed.

Figure 6:
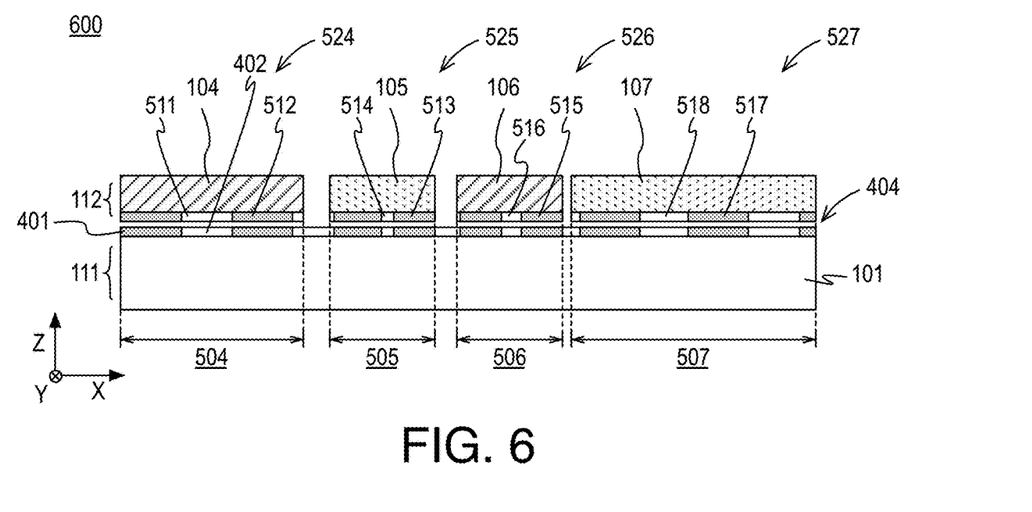
FIG. 6 illustrates an IC structure similar to the IC structure of FIG. 5 after self assembly of IC die structures and thermal die structures to their corresponding regions.

FIG. 6 illustrates an IC structure 600 similar to IC structure 500 after self assembly of IC die structures 525, 527 and thermal die structures 524, 526 to their corresponding regions 505, 507, 504, 506, arranged in accordance with at least some implementations of the present disclosure. As shown, IC die structure 525 self aligns to region 505 such that metallization structures 513 are aligned to corresponding metallization structures of metallization structures 401 and dielectric material 514 aligns with a portion of dielectric material 402. Similarly, IC die structure 527 self aligns to region 507 such that metallization structures 517 are aligned to corresponding metallization structures of metallization structures 401 and dielectric material 518 aligns with a portion of dielectric material 402. Furthermore, thermal die structure 524 self aligns to region 504 such that metallization structures 512 are aligned to corresponding metallization structures of metallization structures 401 and dielectric material 511 aligns with a portion of dielectric material 402 and thermal die structure 526 self aligns to region 506 such that metallization structures 515 are aligned to corresponding metallization structures of metallization structures 401 and dielectric material 516 aligns with a portion of dielectric material 402.

Returning to FIG. 3, processing continues at operation 303, where hybrid bonding is performed to direct bond the self assembled IC and thermal dies to the first level to from a second die level. Such hybrid or direct bonding may be performed using any suitable technique or techniques. In some embodiments, compression is provided to bring the IC and thermal dies of the second level into contact with the exposed surface of the first level. In some embodiments, materials used to align the second level may be evaporated off or removed. When brought into close contact, the aligned dielectric materials of the first and second levels may first bond at room temperature due to, for example, Van der Waals forces therebetween. A subsequent anneal or thermal process is performed to bond the metallization structures due to inter-diffusion of the metals to form a composite metal structure as discussed herein. Such direct bonding advantageously offers a strong bond, small z-height, and no intervening bonding materials.

Figure 7:
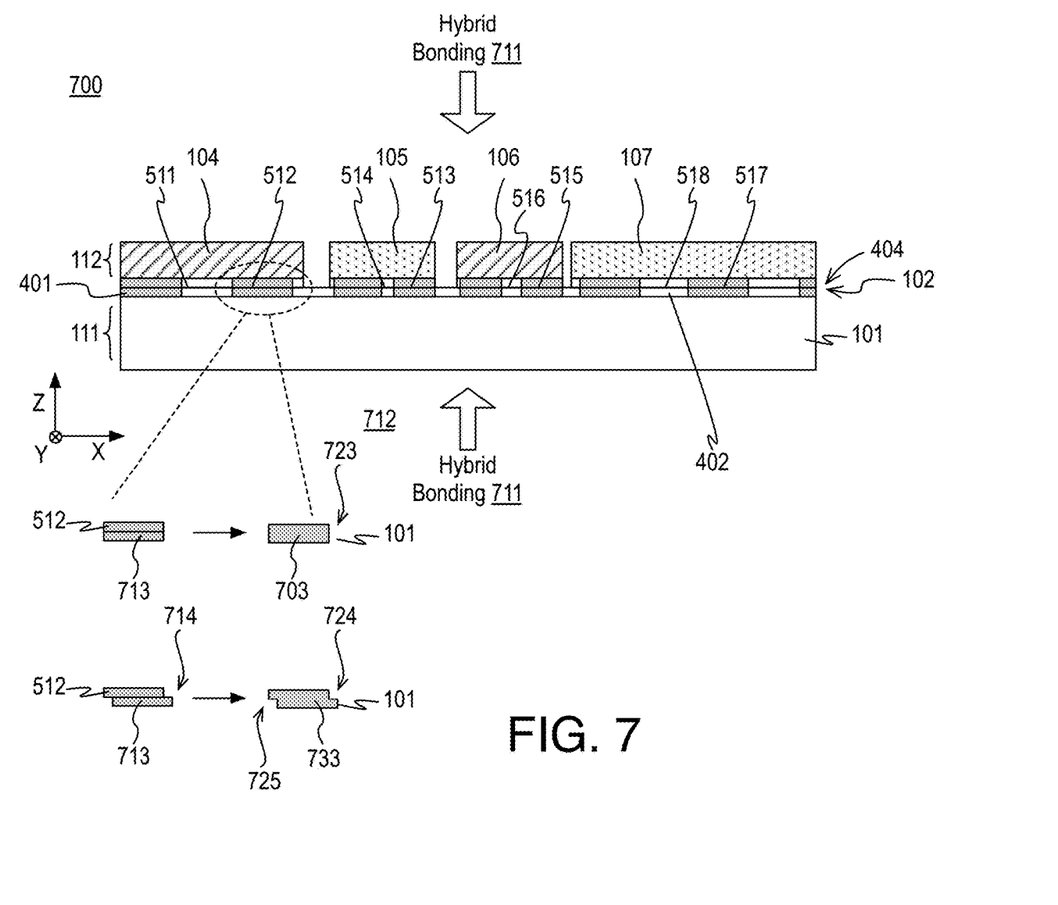
FIG. 7 illustrates an IC structure similar to the IC structure of FIG. 6 as hybrid bonding is being performed to direct bond IC die structures and thermal die structures to their corresponding regions.

FIG. 7 illustrates an IC structure 700 similar to IC structure 600 as hybrid bonding is being performed to direct bond IC die structures 525, 527 and thermal die structures 524, 526 to their corresponding regions 505, 507, 504, 506, arranged in accordance with at least some implementations of the present disclosure. As shown, a hybrid bonding operation 711 may first apply compression using any suitable technique or techniques to bring IC die structures 525, 527 and thermal die structures 524, 526 into contact with surface 404 under pressure. Such close contact under pressure first bonds adjacent dielectric materials inclusive of dielectric materials 511, 514, 516, 518 bonding to corresponding portions of dielectric material 402.

Figure 8A:
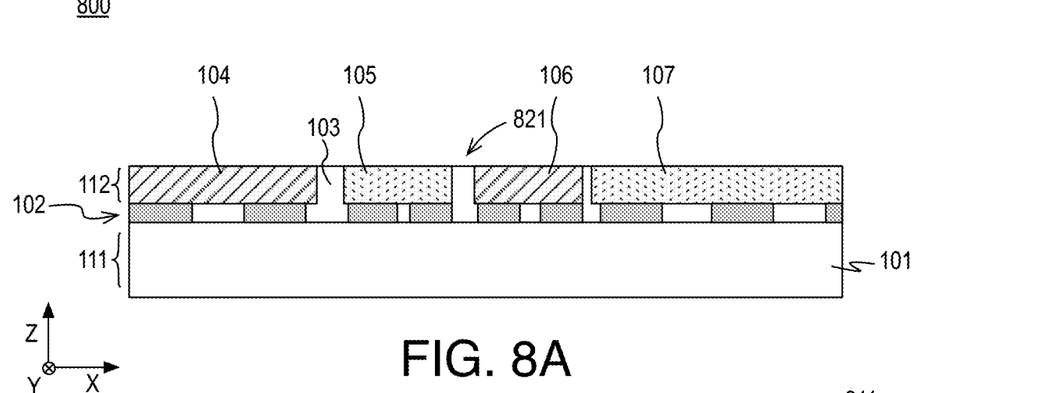
FIG. 8A illustrates IC structure similar to the IC structure of FIG. 6 after completion of hybrid bonding and dielectric material fill.

Optionally while still under compressive force, an anneal operation (not shown) is provided to bring IC structure 700 to an elevated temperature. Such anneal, as discussed, bonds adjacent ones of metallization structures 512, 513, 515, 517 and metallization structures 401 to form composite metallization structures 102 as shown in FIGS. 1, 8A, and elsewhere herein. As shown in insert 712, in some embodiments, adjacent metallization structures such as metallization structure 512 and metallization structure 713 (one of metallization structures 401) are annealed to form a composite metallization structure 703 (one of composite metallization structures 102) such that metallization structure 703 has a substantially aligned sidewalls 723. However, in other embodiments, adjacent metallization structures such as metallization structure 512 and metallization structure 713 have a misalignment 714 during anneal and form a composite metallization structure 733 such that metallization structure 733 has a substantially misaligned sidewalls and therefore metallization structure 733 includes a jut 724 and an overhang 725. For example, the sidewall of metallization structure 733 may have substantially vertical sidewall portions and a substantially horizontal sidewall portion (e.g., at jut 724 and overhang 725).

Returning to FIG. 3, processing continues at operation 304, where a dielectric fill is performed to fill interstitials between IC and thermal dies of the second level with dielectric material. Such dielectric fill may be performed using any suitable technique or techniques such as chemical vapor deposition, physical vapor deposition, or other deposition techniques. In some embodiments, the dielectric fill material matches that of the dielectric material used to bond the second level dies to the first level dies, although different materials may be used.

FIG. 8A illustrates IC structure 800 similar to IC structure 700 after completion of hybrid bonding and dielectric material fill, arranged in accordance with at least some implementations of the present disclosure. Notably, IC structure 800 matches IC structure 100 as illustrated in FIG. 1. Dielectric material 103 may include portions of dielectric materials 511, 514, 516, 518, 402 as well as an added dielectric fill 821 with all such materials being illustrated generally as dielectric material 103. Such operations may be repeated any number of times to form any number of die levels such as three, four, or more. An exemplary three die level 3D die stack is illustrated with respect to FIGS. 9 and 10 herein below. In addition, engineered heat spreader 201 may be bonded to second level 112 using similar techniques.

Figure 8B:
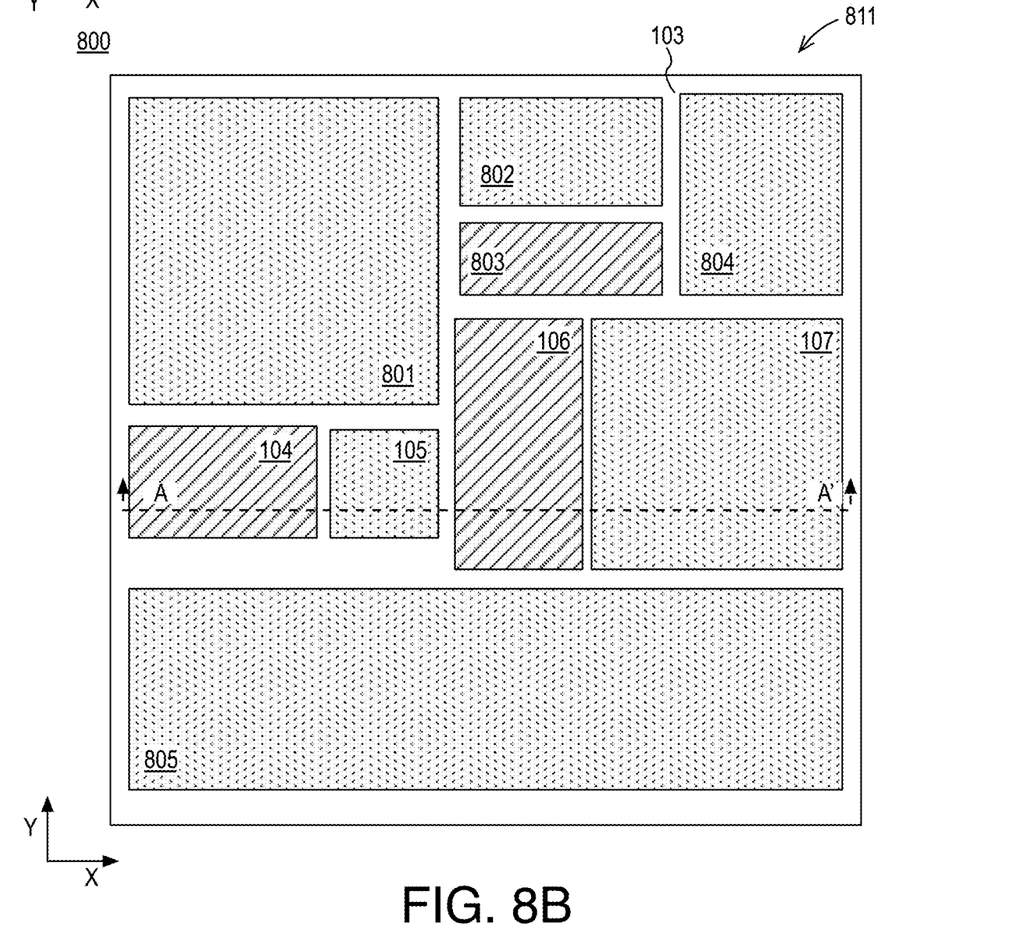
FIG. 8B illustrates a top down view of the IC structure of FIG. 8A.

Furthermore, FIG. 8B illustrates a top down view of IC structure 800 (i.e., IC structure 100) such that the cross-sectional side view of IC structure 100 is taken along the A-A' plane in FIG. 8B. As shown, thermal dies 104, 106 and IC dies 105, 107 may be part of second level architecture 811 inclusive of any number of IC dies 105, 107, 801, 802, 804, 805 and thermal dies 104, 106, 803 of any suitable size and shape. As discussed, in some embodiments, a largest dimension in the x-y plane of one or more of IC dies 105, 107, 801, 802, 804, 805 and/or thermal dies 104, 106, 803 is not more than 5 mm, 2 mm, or 1 mm. Furthermore, a significant number of IC dies 105, 107, 801, 802, 804, 805 and thermal dies 104, 106, 803 (e.g., 9 as shown) such as 8 or more, 12 or more, or even 16 or more may be deployed due to the efficiencies provided by the disclosed self assembly and hybrid bonding techniques.

Returning to FIG. 3, processing continues at operation 305, where an engineered heat spreader may be bonded to the resultant 3D die stack and/or heat dissipation modules may be attached to the resultant 3D die stack. For example, a 3D die stack having any number of levels may be generated using operations 301-304. Subsequently, an engineered heat spreader may be bonded to the top (or bottom) level of the 3D die stack using the discussed bonding techniques to form assembly structure 200 discussed with respect to FIG. 2. In addition or in the alternative, a heat dissipation module may be attached to one or both sides of the 3D dies stack, an example of which is shown herein with respect to FIG. 10. As used herein, the term heat dissipation module indicates a module, component or structure used to dissipate heat and is inclusive of passive heat spreaders (optionally with a thermal interface material between the passive heat spreader and a surface of the 3D die stack), heat sinks or active thermal devices such as heat exchangers or heat pumps.

Figure 9:
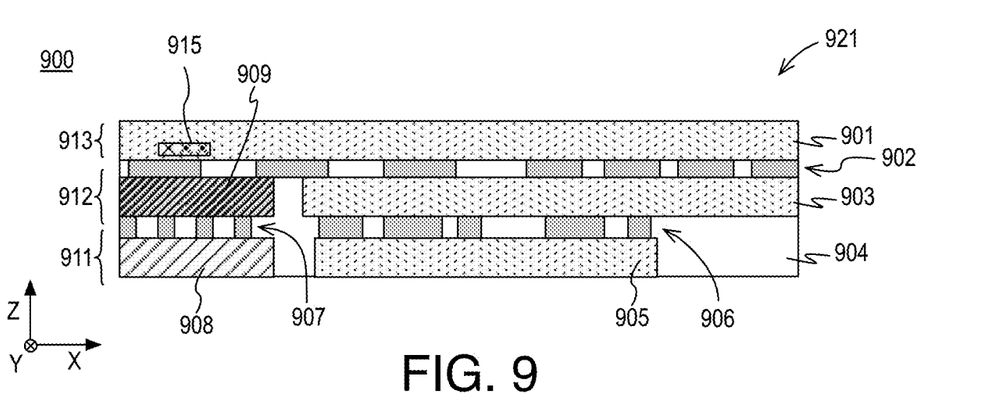
FIG. 9 is an illustration of a cross-sectional side view of another integrated circuit (IC) structure having improved thermal performance.

FIG. 9 is an illustration of a cross-sectional side view of another integrated circuit (IC) structure 900 having improved thermal performance, arranged in accordance with at least some implementations of the present disclosure. IC structure 900 may also be characterized as an assembly structure, assembly, apparatus, system, die stack, package etc. As shown, IC structure 900 includes an IC die 901 at a third level 913 (e.g., a top level) of a 3D die stack 921, an active thermal die 909 and an IC die 903 in a second level 912 (e.g., a middle level) of 3D die stack 921, and a passive thermal die 908 and an IC die 905 in a first level 911 (e.g., a bottom level). Such IC dies 901, 903, 905 may have any characteristics discussed herein with respect to other IC dies and are inclusive of electrically functional die. Passive thermal die 908 includes a die having a thermal conductivity greater than that of IC dies 901, 903, 905 and may include any materials or characteristics discussed elsewhere with respect to passive thermal dies. Active thermal die 909 includes a thermal die such as a thermoelectric cooling module that provide active cooling when powered on. For example, Peltier device thermoelectric cooling modules may be deployed. Furthermore, such dies may be embedded in dielectric material 904

As shown, active thermal die 909 of second level 912 is direct bonded to IC die 901 via one or more of composite metallization structures 902 and IC die 903 is also direct bonded to IC die 901 via one or more of composite metallization structures 902. Such bonding and other direct bonds in 3D die stack 921 may be performed using self-assembly and/or hybrid bonding techniques as discussed herein with respect to process 300. Similarly, passive thermal die 908 is direct bonded to active thermal die 909 via one or more of composite metallization structures 907 and IC die 905 is direct bonded to IC die 903 via composite metallization structures 906.

Notably, the embodiment illustrated in FIG. 9 includes a three level 911, 912, 913 (e.g., 3-die stack) to remove more heat from a hotspot 915 in IC die 901 (e.g., the top die) such that a middle silicon, for example, IC die is disaggregated into a smaller IC die 903 and active thermal die 909 such as a thermoelectric cooling module such that active thermal die 909 sits under hotspot 915. Passive thermal die 908 having thermally conductive materials as discussed herein is placed in the same level (e.g., first level 911) as IC die 905 (e.g., the bottom die) and under the die shadow of active thermal die 909. That is active thermal die 909 and passive thermal die 908 are at least partially vertically aligned. As used herein the term partially vertically aligned indicates an overlap in the x-y plane of two components when their borders are extended in the vertical direction (i.e., z-direction). Using such a structure, active thermal die 909 removes heat from hotspot 915 of IC die 901 (e.g., the top die) downward through passive die 908 and out of 3D die stack 921. Furthermore, heat dissipation modules may be employed to further remove heat from 3D die stack 921.

Figure 10:
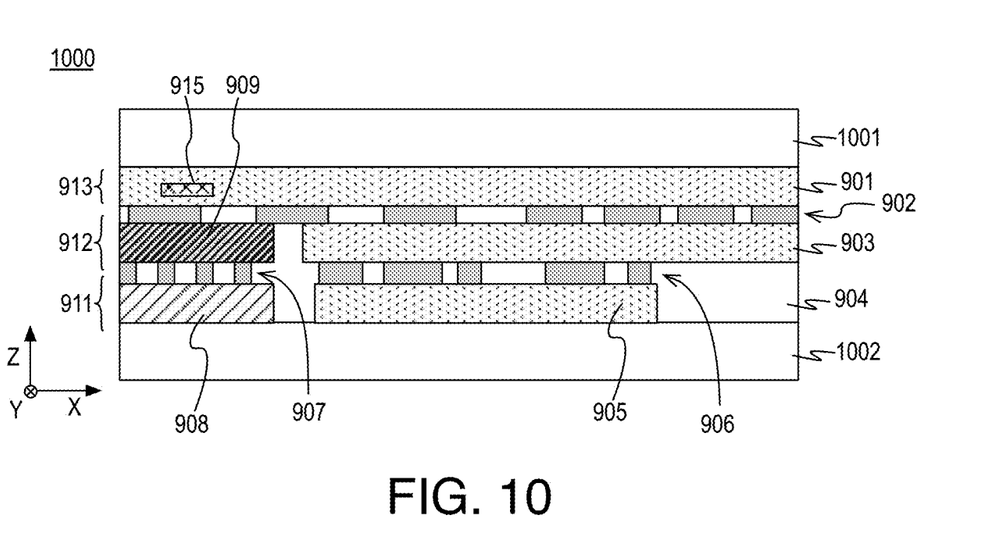
FIG. 10 is an illustration of a cross-sectional side view of an assembly structure similar to the IC structure of FIG. 9 after the deployment of top and bottom heat dissipation modules.

FIG. 10 is an illustration of a cross-sectional side view of an assembly structure 1000 similar to IC structure 900 after the deployment of top and bottom heat dissipation modules 1001, 1002, arranged in accordance with at least some implementations of the present disclosure. Assembly structure 1000 may also be characterized as an IC circuit structure, assembly, apparatus, system, package, etc. As shown, assembly structure 1000 includes top heat dissipation module 1001 and bottom heat dissipation module 1002. In some embodiments, only one of heat dissipation modules 1001, 1002 may be used. One or both of heat dissipation modules 1001, 1002 may be any of passive heat spreaders (optionally with a thermal interface material between the passive heat spreader and a surface of the 3D die stack), heat sinks, or active thermal devices such as heat exchangers or heat pumps. Heat dissipation modules 1001, 1002 may also be characterized as a cooling solution such that a cooling solution indicates a structure to remove heat from a 3D die stack to an outside environment.

Notably, in the context of assembly structure 1000, active thermal die 909 removes heat from hotspot 915 of IC die 901 (e.g., the top die) downward through passive die 908 and out of 3D die stack 921 to bottom heat dissipation module 1002 while top heat dissipation module 1001 removes heat from IC die 901 (e.g., the top die) directly. By removing heat both upward and downward from hotspot 915 (as opposed to only upward in the absence of thermal dies 909 and 908), improved thermal management and lower junction temperatures are achieved.

Figure 11:
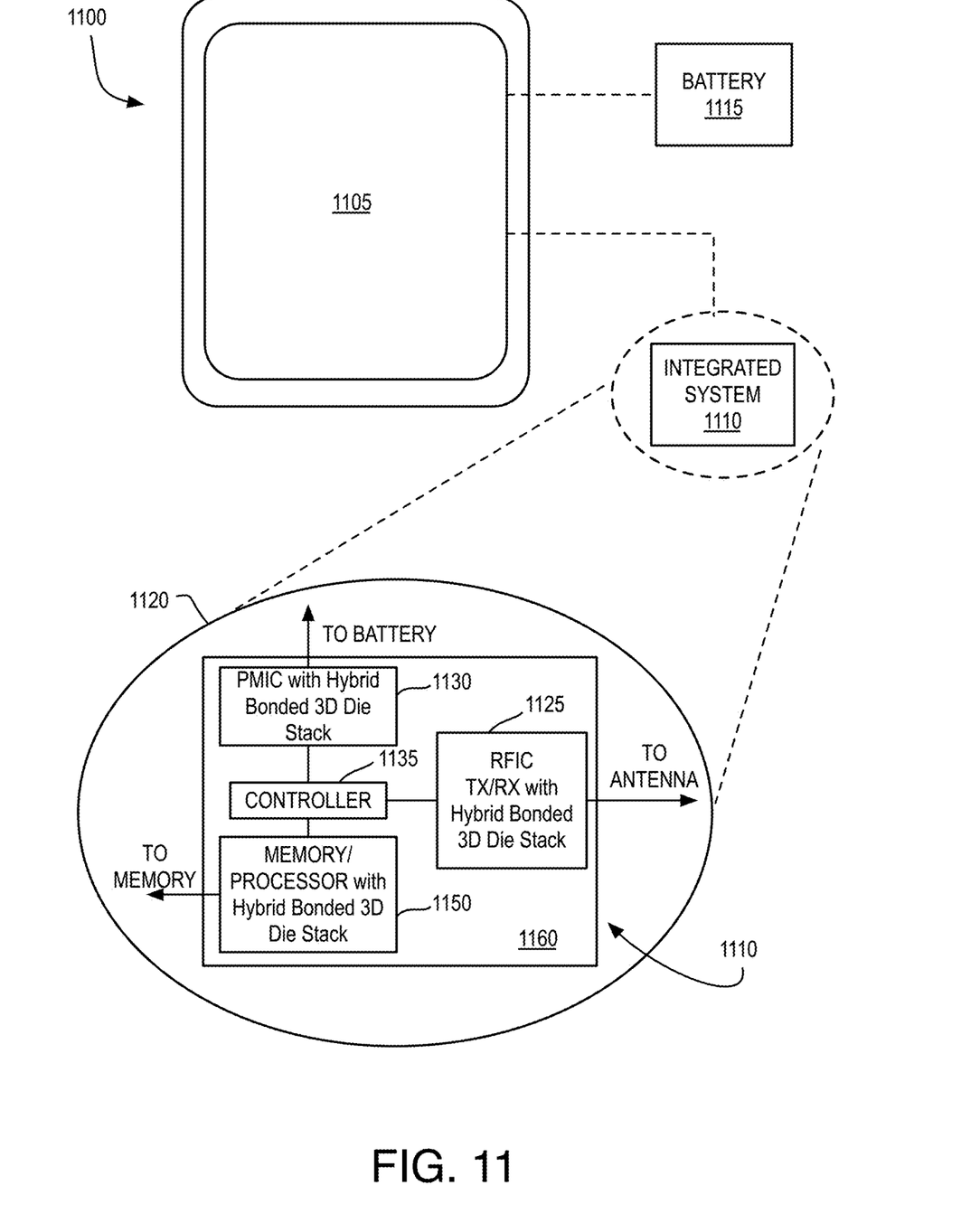
FIG. 11 is an illustrative diagram of a mobile computing platform employing a device having a titanium and silicon contact layer coupled to a silicon and germanium source or drain.

FIG. 11 is an illustrative diagram of a mobile computing platform 1100 employing one or more improved thermal performance hybrid bonded 3D die stacks inclusive of any die stack structure discussed herein, arranged in accordance with at least some implementations of the present disclosure. Any hybrid bonded 3D die stack inclusive of any components, materials, or characteristics discussed herein may be implemented by any component of mobile computing platform 1100. Mobile computing platform 1100 may be any portable device configured for each of electronic data display, electronic data processing, wireless electronic data transmission, or the like. For example, mobile computing platform 1100 may be any of a tablet, a smart phone, a netbook, a laptop computer, etc. and may include a display screen 1105, which in the exemplary embodiment is a touchscreen (e.g., capacitive, inductive, resistive, etc. touchscreen), a chip-level (system on chip—SoC) or package-level integrated system 1110, and a battery 1115. Battery 1115 may include any suitable device for providing electrical power such as a device consisting of one or more electrochemical cells and electrodes to couple to an outside device. Mobile computing platform 1100 may further include a power supply to convert a source power from a source voltage to one or more voltages employed by other devices of mobile computing platform 1100.

Integrated system 1110 is further illustrated in the expanded view 1120. In the exemplary embodiment, packaged device 1150 (labeled "Memory/Processor" in FIG. 11) includes at least one memory chip (e.g., RAM), and/or at least one processor chip (e.g., a microprocessor, a multi-core microprocessor, or graphics processor, or the like). In an embodiment, the packaged device 1150 is a microprocessor including an SRAM cache memory. As shown, device 1150 may employ a die or device having any 3D die stack and/or related characteristics discussed herein. Packaged device 1150 may be further coupled to (e.g., communicatively coupled to) a board, a substrate, or an interposer 1160 along with, one or more of a power management integrated circuit (PMIC)0, RF (wireless) integrated circuit (RFIC) 1125 including a wideband RF (wireless) transmitter and/or receiver (TX/RX) (e.g., including a digital baseband and an analog front end module further comprises a power amplifier on a transmit path and a low noise amplifier on a receive path), and a controller 1135 thereof. In general, packaged device 1150 may be also be coupled to (e.g., communicatively coupled to) display screen 1105. As shown, one or both of PMIC 1130 and/or RFIC 1125 may employ a die or device having any 3D die stack and/or related characteristics discussed herein.

Functionally, PMIC 1130 may perform battery power regulation, DC-to-DC conversion, etc., and so has an input coupled to battery 1115 and with an output providing a current supply to other functional modules. In an embodiment, PMIC 1130 may perform high voltage operations. As further illustrated, in the exemplary embodiment, RFIC 1125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1150 or within a single IC (SoC) coupled to the package substrate of the packaged device 1150.

Figure 12:
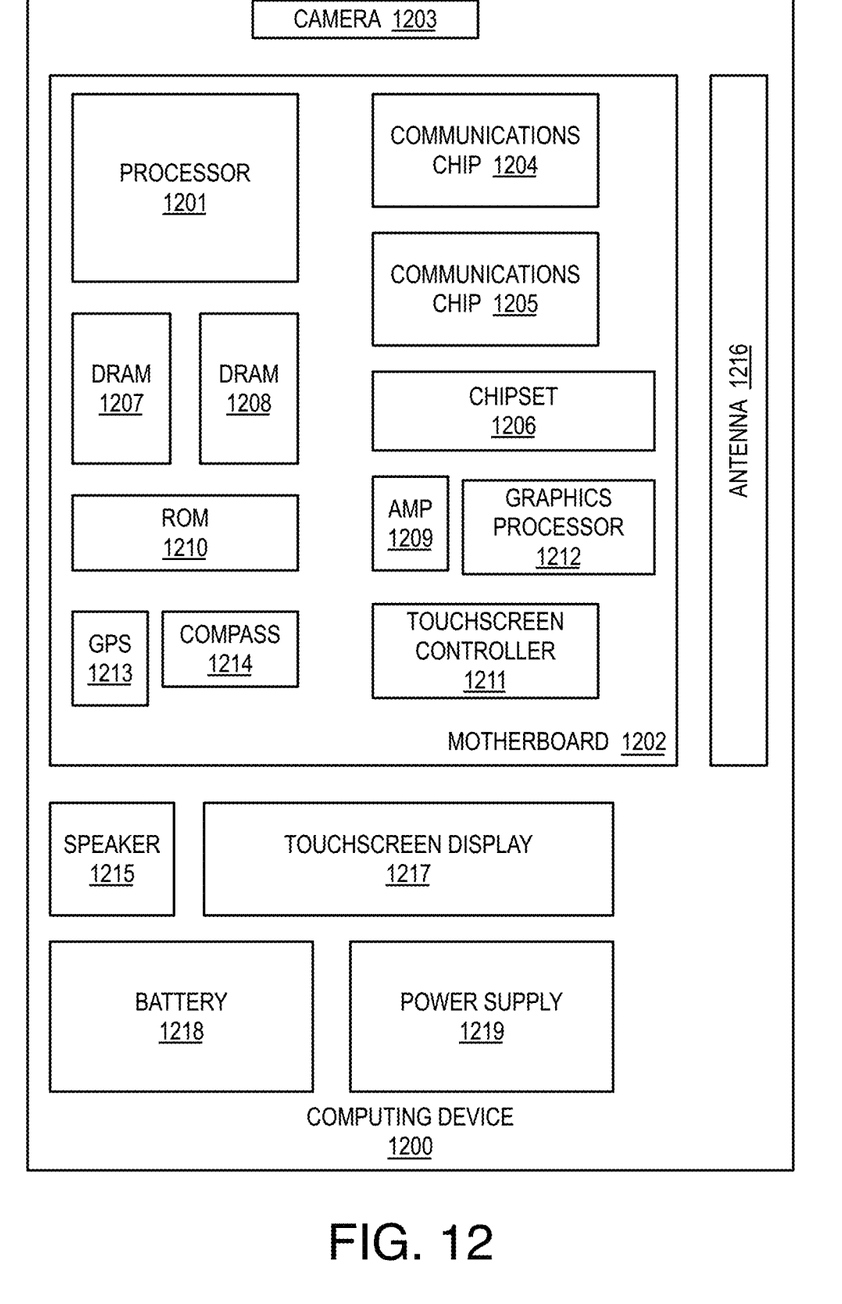
FIG. 12 is a functional block diagram of a computing device, all arranged in accordance with at least some implementations of the present disclosure.

FIG. 12 is a functional block diagram of a computing device 1200, arranged in accordance with at least some implementations of the present disclosure. Computing device 1200 may be found inside platform 1100, for example, and further includes a motherboard 1202 hosting a number of components, such as but not limited to a processor 1201 (e.g., an applications processor) and one or more communications chips 1204, 1205. Processor 1201 may be physically and/or electrically coupled to motherboard 1202. In some examples, processor 1201 includes an integrated circuit die packaged within the processor 1201. In general, the term "processor" may refer to any device or portion of a device that processes electronic data from registers and/or memory to transform that electronic data into other electronic data that may be stored in registers and/or memory. Any one or more device or component of computing device 1200 may include a die or device having any 3D die stack and/or related characteristics discussed herein as discussed herein.

In various examples, one or more communication chips 1204, 1205 may also be physically and/or electrically coupled to the motherboard 1202. In further implementations, communication chips 1204 may be part of processor 1201. Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics processor 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, a battery 1218, and a power supply 1219, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1204, 1205 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1204, 1205 may implement any of a number of wireless standards or protocols, including but not limited to those described elsewhere herein. As discussed, computing device 1200 may include a plurality of communication chips 1204, 1205. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1219 may convert a source power from a source voltage to one or more voltages employed by other devices of mobile computing platform 1100. In some embodiments, power supply 1219 converts an AC power to DC power. In some embodiments, power supply 1219 converts an DC power to DC power at one or more different (lower) voltages. In some embodiments, multiple power supplies are staged to convert from AC to DC and then from DC at a higher voltage to DC at a lower voltage as specified by components of computing device 1200.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, an integrated circuit (IC) structure comprises one or more first IC dies in a first layer of a 3D die stack, a plurality of second IC dies in a second layer of the 3D die stack each direct bonded to at least one of the one or more first IC dies via one or more first composite metal structures, and a plurality of thermal dies in the second layer of the 3D die stack each direct bonded to at least one of the one or more first IC dies via one or more second composite metal structures, such that the plurality of thermal dies each has a greater thermal conductivity than each of the second IC dies or comprises an active thermal cooling die.

In one or more second embodiments, further to the first embodiment, the IC structure further comprises a heat spreader over surfaces of the plurality of second IC dies and the plurality of thermal dies opposite the one or more first dies.

In one or more third embodiments, further to the first or second embodiments, the heat spreader is direct bonded to one or more of the plurality of second IC dies and one or more of the plurality of thermal dies via third composite metal structures directly coupled to the heat spreader and the one or more of the plurality of second IC dies and the one or more of the plurality of thermal dies.

In one or more fourth embodiments, further to any of the first through third embodiments, the one or more first IC dies comprises a top side IC die, a first thermal die of the plurality of thermal dies comprises an active thermal die, and the IC structure further comprises a second thermal die in a third layer of the 3D die stack and a third IC die in the third layer of the 3D die stack.

In one or more fifth embodiments, further to any of the first through fourth embodiments, the second thermal die comprises a passive thermal die having a greater thermal conductivity than the third IC die, and wherein the second thermal die is at least partially vertically aligned with the first thermal die.

In one or more sixth embodiments, further to any of the first through fifth embodiments, the IC structure further comprises a first heat dissipation module over a top surface of the top side IC die and a second dissipation module under a bottom surface of the third thermal die.

In one or more seventh embodiments, further to any of the first through sixth embodiments, a first thermal die of the plurality of thermal dies comprises a greater thermal conductivity than each of the second IC dies, the first thermal die predominantly comprising one of diamond, copper, silver, gold, aluminum nitride, boron arsenide, or silicon carbide.

In one or more eighth embodiments, further to any of the first through seventh embodiments, a first thermal die of the plurality of thermal dies comprises an active thermal die comprising a thermoelectric cooling module.

In one or more ninth embodiments, further to any of the first through eighth embodiments, one or more of the plurality of second IC dies and the plurality of thermal dies comprise a largest dimension in plane with a surface of the first IC die of not more than 5 mm.

In one or more tenth embodiments, a system comprises a power supply and an integrated circuit (IC) structure coupled to the power supply, the IC structure comprising one or more first IC dies in a first layer of a 3D die stack, a plurality of second IC dies in a second layer of the 3D die stack each direct bonded to at least one of the one or more first IC dies via one or more first composite metal structures, and a plurality of thermal dies in the second layer of the 3D die stack each direct bonded to at least one of the one or more first IC dies via one or more second composite metal structures, wherein the plurality of thermal dies each has a greater thermal conductivity than each of the second IC dies or comprises an active thermal cooling die.

In one or more eleventh embodiments, further to the tenth embodiment, the system further comprises a heat spreader over surfaces of the plurality of second IC dies and the plurality of thermal dies opposite the one or more first dies, such that the heat spreader is direct bonded to one or more of the plurality of second IC dies and one or more of the plurality of thermal dies via composite metal structures directly coupled to the heat spreader and the one or more of the plurality of second IC dies and the one or more of the plurality of thermal dies.

In one or more twelfth embodiments, further to the tenth or eleventh embodiments, the one or more first IC dies comprises a top side IC die, a first thermal die of the plurality of thermal dies comprises an active thermal die, and the IC structure further comprises a second thermal die in a third layer of the 3D die stack and a third IC die in the third layer of the 3D die stack.

In one or more thirteenth embodiments, further to any of the tenth through twelfth embodiments, the second thermal die comprises a passive thermal die having a greater thermal conductivity than the third IC die, and the second thermal die is at least partially vertically aligned with the first thermal die.

In one or more fourteenth embodiments, further to any of the tenth through thirteenth embodiments, a first thermal die of the plurality of thermal dies comprises a greater thermal conductivity than each of the second IC dies, the first thermal die predominantly comprising one of diamond, copper, silver, gold, aluminum nitride, boron arsenide, or silicon carbide, or the first thermal die of the plurality of thermal dies comprises an active thermal die comprising a thermoelectric cooling module.

In one or more fifteenth embodiments, a method comprises forming a plurality of first metallization structures within a first dielectric material over a top surface of one or more dies of a first die level, batch self-assembling a second die level over the first die level by selectively aligning a thermal die over a first region of the first die level and an integrated circuit die over a second region of the first die level, the thermal die comprising a second metallization structure within a second dielectric material and the integrated circuit die comprising a third metallization structure within a third dielectric material, and hybrid bonding the thermal die and the integrated circuit die of the second level to the first die level via bonding the second metallization structure to one of the first metallization structures in addition to bonding portions of the first and second dielectric materials, and bonding the third metallization structure to another one of the first metallization structures in addition to bonding portions of the first and third dielectric materials.

In one or more sixteenth embodiments, further to the fifteenth embodiment, said batch self-assembling the second die level over the first die level comprises at least one of alignment of a first hydrophobic surface of one of the thermal die or the integrated circuit die to a second hydrophobic surface of one of the first or second regions in a water medium, magnetically aligning one of the thermal die or the integrated circuit die, or aligning one of the thermal die or the integrated circuit die using shape matching.

In one or more seventeenth embodiments, further to the fifteenth or sixteenth embodiments, said batch self-assembling comprises a single batch self-assembling operation that contemporaneously aligns the thermal die and the integrated circuit die in parallel.

In one or more eighteenth embodiments, further to any of the fifteenth through seventeenth embodiments, the method further comprises bonding a third die level comprising a second thermal die to the second die level, wherein the thermal die comprises an active thermal die and the active thermal die and the second thermal die are at least partially vertically aligned.

In one or more nineteenth embodiments, further to any of the fifteenth through eighteenth embodiments, the method further comprises attaching a first thermal solution adjacent the first die level and a second thermal solution adjacent the third die level, wherein the second thermal die is a passive thermal die coupled to the second thermal solution.

In one or more twentieth embodiments, further to any of the fifteenth through nineteenth embodiments, the thermal die comprises a greater thermal conductivity than any integrated circuit dies of the first die level, or the thermal die comprises an active thermal die comprising a thermoelectric cooling module.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   one or more first IC dies in a first layer of a 3D die stack;
   a plurality of second IC dies in a second layer of the 3D die stack each direct bonded to at least one of the one or more first IC dies via a plurality of first composite metal structures between the second IC dies and the one or more first IC dies and embedded in a first dielectric structure; and
   a plurality of thermal dies in the second layer of the 3D die stack each direct bonded to at least one of the one or more first IC dies via a plurality of second composite metal structures between the thermal dies and the one or more first IC dies and embedded in a second dielectric structure, wherein the thermal dies each has a greater thermal conductivity than each of the second IC dies or comprises an active thermal cooling die.

2. The IC structure of claim 1, further comprising:
   a heat spreader over surfaces of the second IC dies and the thermal dies opposite the one or more first dies, wherein the heat spreader is direct bonded to one or more of the second IC dies and one or more of the thermal dies via a plurality of third composite metal structures directly coupled to the heat spreader and the one or more of the second IC dies and the one or more of the thermal dies.

3. The IC structure of claim 1, wherein each of the first composite metal structures and the second composite metal structures comprises a first metal substructure adjacent the one or more first IC dies and a second metal substructure adjacent the second IC dies or the thermal dies, the first metal substructures and the second metal substructures comprising copper, and wherein each of the first dielectric structure and the second dielectric structure comprises silicon and one of oxygen or nitrogen.

4. The IC structure of claim 1, wherein the one or more first IC dies comprises a top side IC die, a first thermal die of the thermal dies comprises an active thermal die, and the IC structure further comprises:
   a second thermal die in a third layer of the 3D die stack direct bonded to the first thermal die by a plurality of third composite metal structures therebetween; and
   a third IC die in the third layer of the 3D die stack direct bonded to one of the second IC dies by a plurality of fourth composite metal structures therebetween.

5. The IC structure of claim 4, further comprising:
   a first heat dissipation module adjacent the first layer of the 3D die stack; and/or
   a second dissipation module adjacent the third layer of the 3D die stack.

6. The IC structure of claim 1, wherein a first thermal die of the thermal dies comprises a greater thermal conductivity than each of the second IC dies, the first thermal die predominantly comprising one of diamond, copper, silver, gold, aluminum nitride, boron arsenide, or silicon carbide.

7. The IC structure of claim 1, wherein a first thermal die of the thermal dies comprises an active thermal die comprising a thermoelectric cooling module.

8. The IC structure of claim 1, further comprising:
   a power supply; and
   a package structure coupled to the power supply, the package structure comprising the one or more first IC dies, the second IC dies, and the thermal dies.

9. An integrated circuit (IC) structure, comprising:
   one or more first IC dies in a first layer of a 3D die stack;
   a plurality of second IC dies in a second layer of the 3D die stack each bonded to at least one of the one or more first IC dies by a first hybrid bond between a first surface of the one or more first IC dies and a second surface of the second IC dies; and
   a plurality of thermal dies in the second layer of the 3D die stack each bonded to at least one of the one or more first IC dies by a second hybrid bond between the first surface of the one or more first IC dies and a third surface of the thermal dies, wherein the plurality of thermal dies each has a greater thermal conductivity than each of the second IC dies or comprises an active thermal cooling die, wherein the first hybrid bond and the second hybrid bond each comprises a plurality of composite metal structures embedded in a dielectric structure, and wherein each of the composite metal structures comprises a first metal substructure adjacent the first surface and a second metal substructure adjacent the second surface or the third surface.

10. The IC structure of claim 9, further comprising:
    a heat spreader over third surfaces of the second IC dies and fourth surfaces of the thermal dies, wherein the heat spreader is bonded to one or more of the second IC dies and one or more of the thermal dies via a plurality of second composite metal structures directly coupled to the heat spreader and the one or more of the second IC dies and the one or more of the thermal dies.

11. The IC structure of claim 9, wherein the one or more first IC dies comprises a top side IC die, a first thermal die of thermal dies comprises an active thermal die, and the IC structure further comprises:
    a second thermal die in a third layer of the 3D die stack bonded to the first thermal die by a plurality of second composite metal structures therebetween; and
    a third IC die in the third layer of the 3D die stack bonded to one of the second IC dies by a plurality of third composite metal structures therebetween.

12. The IC structure of claim 11, further comprising:
a first heat dissipation module adjacent the first layer of the 3D die stack; and/or
a second dissipation module adjacent the third layer of the 3D die stack.

13. The IC structure of claim 9, wherein a first thermal die of the thermal dies comprises a greater thermal conductivity than each of the second IC dies, the first thermal die predominantly comprising one of diamond, copper, silver, gold, aluminum nitride, boron arsenide, or silicon carbide, or the first thermal die of the thermal dies comprises a thermoelectric cooling module.

14. The IC structure of claim 9, further comprising:
a power supply; and
a package structure coupled to the power supply, the package structure comprising the one or more first IC dies, the second IC dies, and the thermal dies.

15. An integrated circuit (IC) structure, comprising:
one or more first IC dies in a first layer of a 3D die stack;
a plurality of second IC dies in a second layer of the 3D die stack each direct bonded to at least one of the one or more first IC dies by a first hybrid bond between a first surface of the one or more first IC dies and a second surface of the second IC dies; and
a plurality of thermal dies in the second layer of the 3D die stack each direct bonded to at least one of the one or more first IC dies by a second hybrid bond between the first surface of the one or more first IC dies and a third surface of the thermal dies, wherein the plurality of thermal dies each has a greater thermal conductivity than each of the second IC dies or comprises an active thermal cooling die, and wherein the first hybrid bond and the second hybrid bond each comprises a plurality of composite metal structures embedded in a dielectric structure, wherein each of the composite metal structures comprises a first metal substructure adjacent the first surface and a second metal substructure adjacent the second surface or the third surface, the first metal substructures and the second metal substructures comprising copper, and wherein the dielectric structure comprises silicon and one of oxygen or nitrogen.

16. The IC structure of claim 15, further comprising:
a heat spreader over third surfaces of the second IC dies and fourth surfaces of the thermal dies, wherein the heat spreader is bonded to one or more of the second IC dies and one or more of the thermal dies via a plurality of second composite metal structures directly coupled to the heat spreader and the one or more of the second IC dies and the one or more of the thermal dies.

17. The IC structure of claim 15, wherein the one or more first IC dies comprises a top side IC die, a first thermal die of thermal dies comprises an active thermal die, and the IC structure further comprises:
a second thermal die in a third layer of the 3D die stack bonded to the first thermal die by a plurality of second composite metal structures therebetween; and
a third IC die in the third layer of the 3D die stack bonded to one of the second IC dies by a plurality of third composite metal structures therebetween.

18. The IC structure of claim 17, further comprising:
a first heat dissipation module adjacent the first layer of the 3D die stack; and/or
a second dissipation module adjacent the third layer of the 3D die stack.

19. The IC structure of claim 15, wherein a first thermal die of the thermal dies comprises a greater thermal conductivity than each of the second IC dies, the first thermal die predominantly comprising one of diamond, copper, silver, gold, aluminum nitride, boron arsenide, or silicon carbide, or the first thermal die of the thermal dies comprises a thermoelectric cooling module.

20. The IC structure of claim 15, further comprising:
a power supply; and
a package structure coupled to the power supply, the package structure comprising the one or more first IC dies, the second IC dies, and the thermal dies.

* * * * *